(12) United States Patent
Spratt

(10) Patent No.: US 6,878,595 B2
(45) Date of Patent: Apr. 12, 2005

(54) TECHNIQUE FOR SUPPRESSION OF LATCHUP IN INTEGRATED CIRCUITS (ICS)

(75) Inventor: James P Spratt, San Marcos, CA (US)

(73) Assignee: Full Circle Research, Inc., Redondo Beach, CA (US)

( * ) Notice: Subject to any disclaimer, the term of this patent is extended or adjusted under 35 U.S.C. 154(b) by 0 days.

(21) Appl. No.: 10/351,690

(22) Filed: Jan. 27, 2003

(65) Prior Publication Data

US 2004/0147080 A1 Jul. 29, 2004

(51) Int. Cl.$^7$ ............................................. H01L 21/336
(52) U.S. Cl. ..................... 438/288; 438/158; 438/300; 438/153; 438/283; 438/220; 438/471; 438/289; 257/372; 257/376; 257/49; 257/50; 257/41; 257/42; 257/48
(58) Field of Search ................................ 438/288, 158, 438/300, 153, 283, 220, 471, 289, 294, 142, 296, 297, 358, 416, 528, 445, 507; 257/372, 376, 41, 42, 48, 49, 50, 612, 610, 611, 394; 357/42, 41, 48, 49, 50

(56) References Cited

U.S. PATENT DOCUMENTS

| | | | | |
|---|---|---|---|---|
| 4,893,164 A | * | 1/1990 | Shirato ........................ | 257/371 |
| 5,164,805 A | * | 11/1992 | Lee .............................. | 257/351 |
| 5,217,923 A | * | 6/1993 | Suguro ....................... | 438/305 |
| 5,384,477 A | * | 1/1995 | Bulucea et al. ............. | 257/372 |
| 5,441,900 A | * | 8/1995 | Bulucea et al. ............. | 438/199 |
| 6,110,767 A | * | 8/2000 | Wu ............................. | 438/158 |
| 6,228,726 B1 | * | 5/2001 | Liaw ........................... | 438/294 |
| 6,368,905 B1 | * | 4/2002 | Kawagoe et al. ........... | 438/199 |
| 6,451,672 B1 | * | 9/2002 | Caruso et al. ............... | 438/471 |

* cited by examiner

Primary Examiner—Matthew Smith
Assistant Examiner—Victor V Yevsikov
(74) Attorney, Agent, or Firm—Robert R. Meads

(57) ABSTRACT

The present invention relates to a technique that can be used to reduce the sensitivity of integrated circuits to a failure mechanism to which some integrated circuits (ICs) are susceptible, known as latchup. The present invention relates to a scheme for suppressing latchup sensitivity by a step to be performed after the IC has been manufactured, rather than being a step in the normal production process. The process involves exposing silicon, either in wafer or die form, to energetic ions, such as protons (hydrogen nuclei) or heavier nuclei (e.g. argon, copper, gold, etc.), having energy sufficient to penetrate the silicon from the back of the wafer or die to within a well-defined distance from the surface of the silicon on which the integrated circuit has been formed (the front surface). The ions will enter the silicon through the surface of the silicon opposite to the surface onto which the integrated circuit has been formed (the back surface), will travel through the silicon, and will be completely stopped within a narrow, controlled distance from the front surface. This very high energy ion implantation will change the properties of silicon in such a way that the process or processes responsible for latchup are inhibited, either from the structural damage done to the single crystal, or from changes in the electrical properties of the silicon due to the chemical properties of the implanted ions, or both. Since the implanted ions all stop within a narrow region, spaced away from the region in which the components of the integrated circuit are located, the functionality and parameters of the IC are not degraded. Consequently, the procedure of the present invention is a method of processing silicon wafers or die so that the sensitivity of the ICs on this wafer or die to latchup is reduced or eliminated.

5 Claims, 9 Drawing Sheets

FIGURE 1: Current-voltage characteristic of CMOS chip
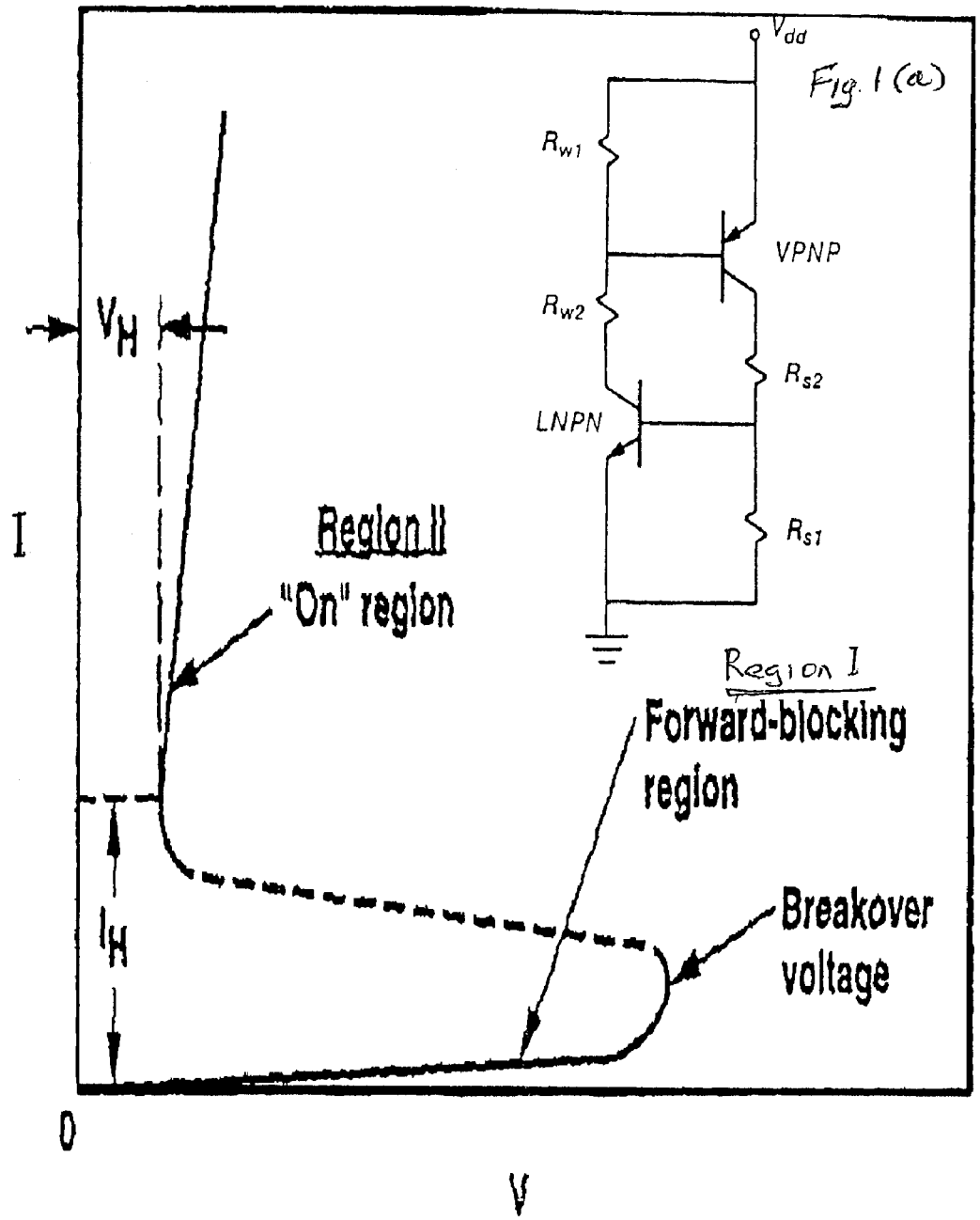

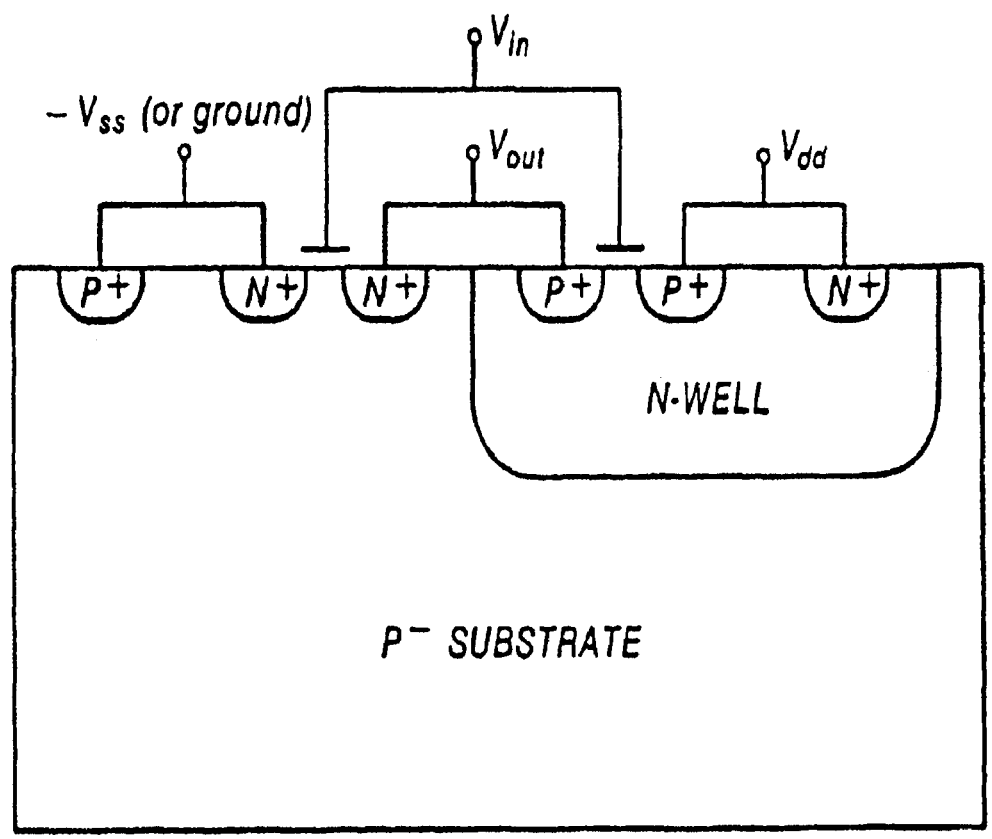
FIGURE 2: Cross Section of Inverter Circuit in N-well CMOS

FIGURE 3: Parasitic bipolar transistors in N-well CMOS
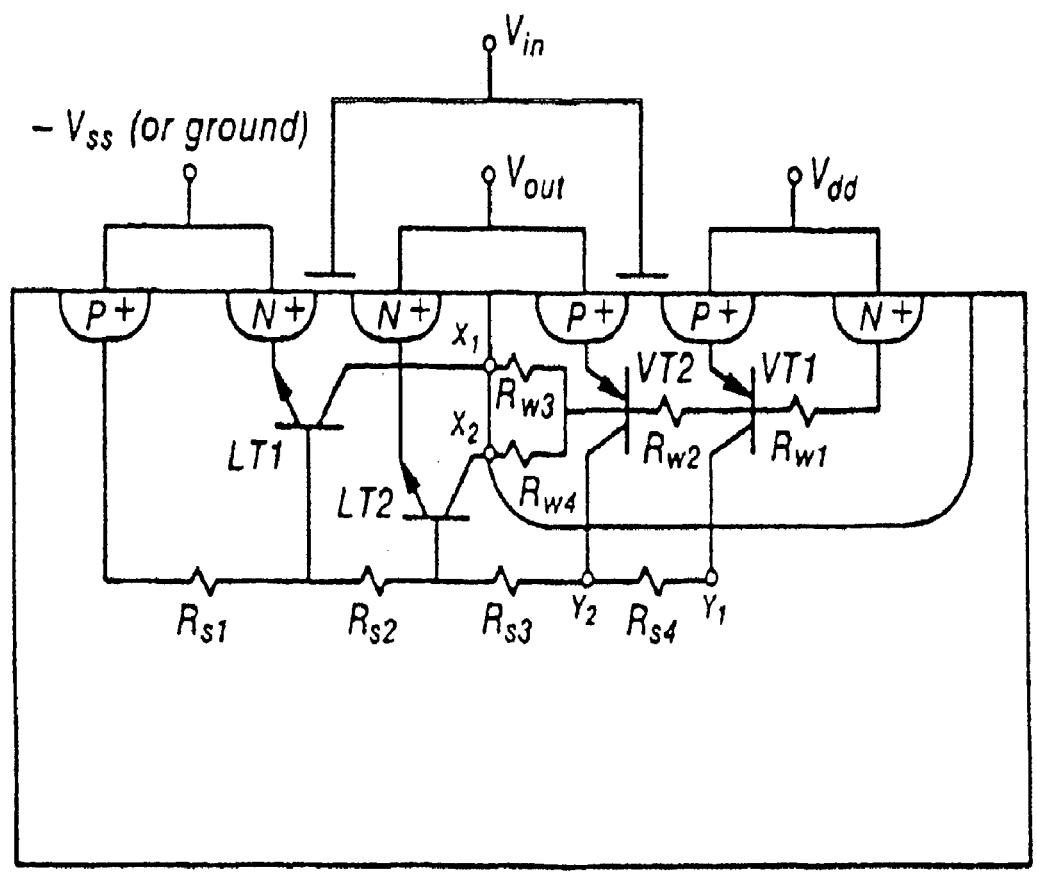

FIGURE 4: Lumped element model of parasitics in CMOS
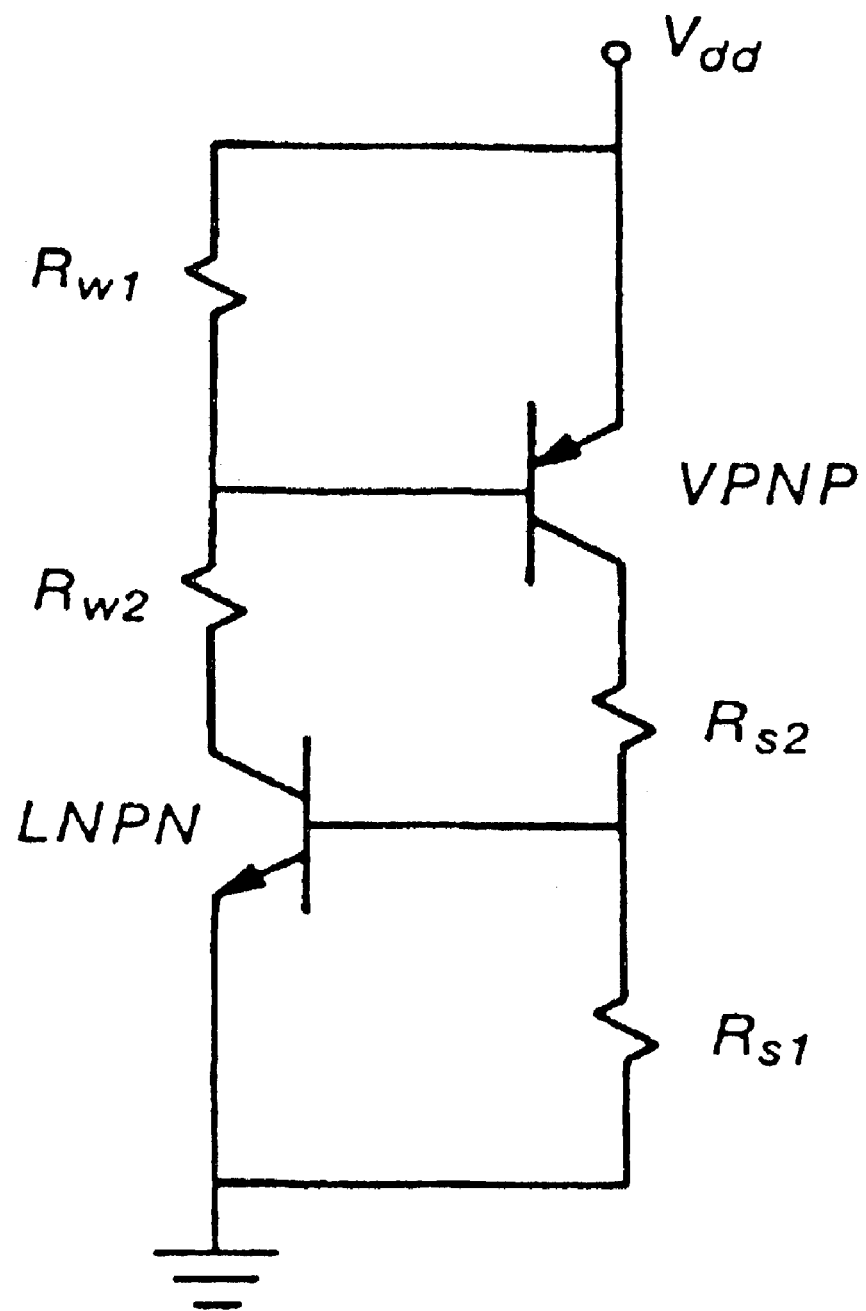

FIGURE 5: LATCHUP TRIGGERING TAXONOMY

| Type | Triggering Mode | Latchup Sequence |
|---|---|---|
| 1A | I/O Node Overshoot | $V \rightarrow VPNP \rightarrow R_s \rightarrow LNPN$ |
| 1B | I/O Node Undershoot | $V \rightarrow LNP \rightarrow R_s \rightarrow LNPN$ |
| 2A | Avalanching N-well | If $R_w > R_s$, then $I \rightarrow R_w \rightarrow VPNP \rightarrow R_s \rightarrow LNPN$ |
| 2B | Photocurrent | If $R_s > R_w$, then $I \rightarrow R_s \rightarrow LNPN \rightarrow R_w \rightarrow VPNP$ |
| 2C | N-well displacement current | |
| 3A | External punchthrough | $I \rightarrow R_w \rightarrow VPNP \rightarrow R_s \rightarrow LNPN$ |
| 3B | Internal punchthrough | $I \rightarrow R_s \rightarrow LNPN \rightarrow R_w \rightarrow VPNP$ |
| 3C | N-channel FET | $I \rightarrow R_w \rightarrow VPNP \rightarrow R_s \rightarrow LNPN$ |
| 3D | P-channel FET | $I \rightarrow R_s \rightarrow LNPN \rightarrow R_w \rightarrow VPNP$ |
| 3E | Avalanching $P^+$ diffusion | $I \rightarrow R_w \rightarrow VPNP \rightarrow R_s \rightarrow LNPN$ |
| 3F | Avalanching $N^+$ diffusion | $I \rightarrow R_s \rightarrow LNPN \rightarrow R_w \rightarrow VPNP$ |

Bragg curves of stopping power vs. residual distance to end of track

FIGURE 7: Boron implanted atom profile, with measured data points, four moment analytical and symmetric Gaussian curves.
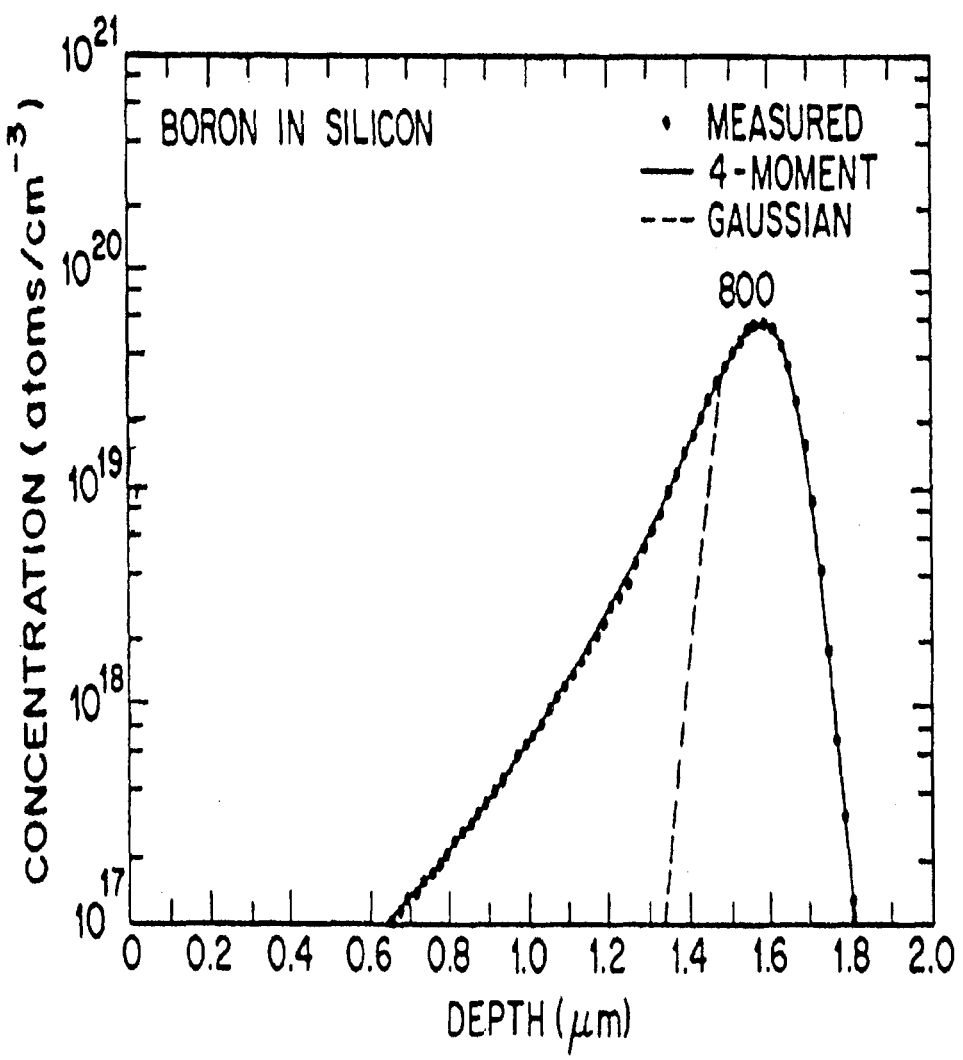

FIGURE 8: Integrated charge collection in epi and bulk structures following a 100 MeV Fe strike
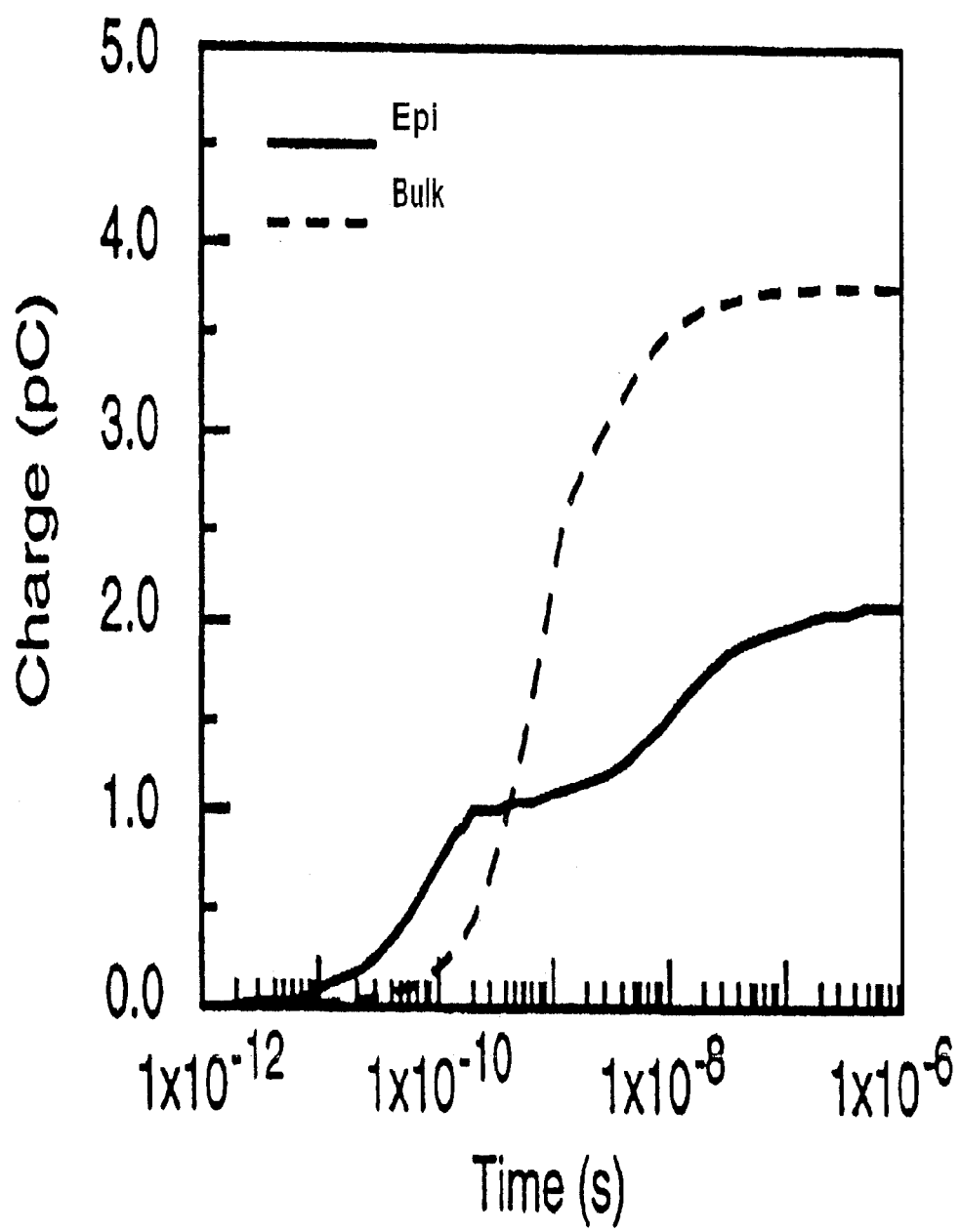

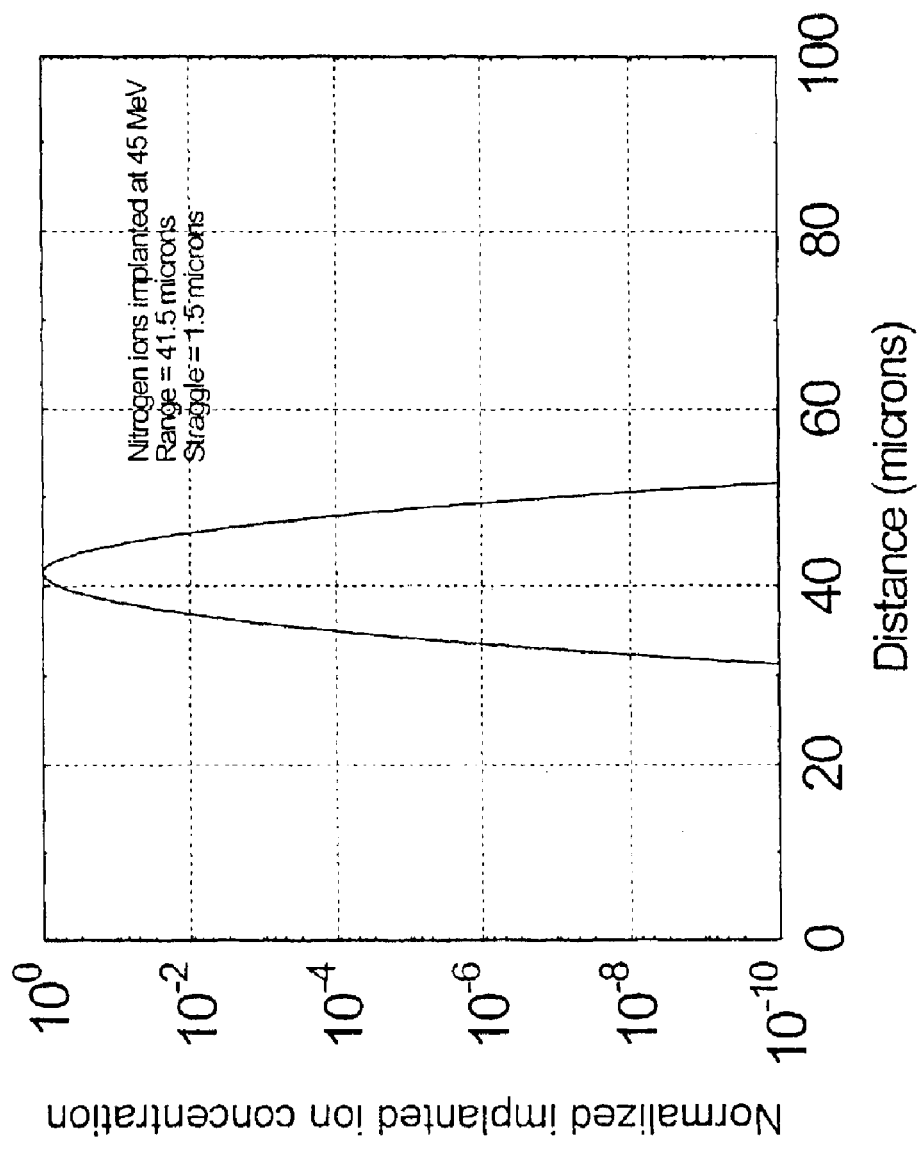
Figure 9: Normalized implanted nitrogen ion concentration vs. distance.

TECHNIQUE FOR SUPPRESSION OF LATCHUP IN INTEGRATED CIRCUITS (ICS)

1.0 FIELD OF INVENTION

The present invention relates to a technique that can be used to reduce the sensitivity of integrated circuits to a failure mechanism to which some integrated circuits (ICs) are susceptible, known as latchup. Latchup is a metastable electrical state into which an IC can be excited, caused by the unintended action of parasitic circuit elements. If it occurs, the IC is rendered either temporarily or permanently inoperable.

More particularly, the present invention relates to a scheme for suppressing latchup sensitivity by a step to be performed after the IC has been manufactured, rather than being a step in the normal production process. The process involves exposing silicon, either in wafer or die form, to energetic ions, such as protons (hydrogen nuclei) or heavier nuclei (e.g. argon, copper, gold, etc.), having energy sufficient to penetrate the silicon from the back of the wafer or die to within a well-defined distance from the surface of the silicon on which the integrated circuit has been formed (the front surface). The protons or other heavy nuclei will enter the silicon through the surface of the silicon opposite to the surface onto which the integrated circuit has been formed (the back surface), will travel through the silicon, and will be completely stopped within a narrow, controlled distance from the front surface. This very high energy ion implantation will change the properties of silicon near the end of range of the ions in such a way that the process or processes responsible for latchup are inhibited, either from the structural damage done to the single crystal, or from changes in the electrical properties of the silicon due to the chemical properties of the implanted ions, or both. Since the implanted ions all stop within a narrow region, spaced away from the region in which the components of the integrated circuit are located, the functionality and parameters of the IC are not degraded. Consequently, the procedure of the present invention is a method of processing silicon wafers or die so that the sensitivity of the ICs on this wafer or die to latchup is reduced or eliminated. Since the thinning and implantation can be done after the chip is manufactured, it need only be performed on those ICs intended for use under conditions where latchup sensitivity is important (such as military or space systems, or high reliability commercial applications). In this way, the cost impact of the procedure on commercial production is avoided, while the additional step greatly enhances the ability to upgrade commercial ICs to radiation tolerant chips through non-intrusive modifications to the commercial fabrication processes.

2.0 BACKGROUND OF INVENTION

Many electronic systems use integrated circuits that employ one of the several IC fabrication technologies that are susceptible to a failure mechanism called latchup. Latchup is a metastable electrical state into which an IC, can be triggered by the unintended action of parasitic circuit elements which are structurally inherent in these chips. It can be initiated either by electrical means, or by exposure to transient ionizing radiation. The former method is a matter of concern to all users of ICs, while the latter is a matter of special concern to systems which may be exposed to nuclear radiation, such as military systems or commercial space systems. Designers of all systems for which high reliability is important want to harden them against the failure mechanism of latchup.

Moreover, as previously noted in general terms, latchup is a metastable electrical state into which an integrated circuit can be excited by the unintended action of parasitic circuit elements. It results from positive feedback between two bipolar transistors, an explicit circuit transistor and a parasitic transistor, or two parasitic transistors, built into the integrated circuit. When two such devices are interconnected in a positive feedback configuration as shown in FIG. 1(a), they can give rise to an "S" type negative resistance characteristic between the voltage supply and ground, also shown in FIG. 1. This configuration can be biased stably at either of two points where a load line intersects the "S" characteristic in a region of positive slope. In normal operation, CMOS ICs are biased in Region I, called the forward blocking region. If an IC is excited into a state where it is biased into Region II in FIG. 1, normal circuit operation is prevented as long as it remains in Region II.

Modern integrated circuits (ICs) consist of many silicon transistors (in some cases, a million or more), manufactured in one piece of silicon, which is usually electrically conductive. Some method of achieving electrical isolation between these many devices is needed, to prevent undesired electrical interconnection. Since the birth of integrated circuit technology, a number of schemes have been proposed for isolating the different devices in ICs. One of the earliest methods advanced is the one that is still the most widely used, viz. "junction isolation". In this method, the isolation is provided by a reverse-biased P-N junction, formed between the silicon starting material and a region or regions in which are devices to be electrically isolated from other regions. Junction isolation is used both in ICs which use bipolar transistor technology and those that use field effect transistor technology (e.g. complementary metal oxide semiconductor, or CMOS, technology). CMOS is the most widely used technology currently in production, so the examples given here will cite examples of CMOS ICs but the concepts apply to any type of IC which uses junction isolation technology.

CMOS is the name applied to an integrated circuit technology that uses both P- and N-channel field effect transistors (FETs) in the same chip. To build P- and N-channel FETs, it is necessary to have both N and P type background material. This is accomplished by starting with a silicon wafer of one type (e.g. P type) and creating in it regions of the opposite type by ion implantation, diffusion, or some other means of doping the starting material in selected areas. The regions where the silicon starting material has been counterdoped to form background material of the opposite conductivity type are known as wells or tubs.

FIG. 2 shows a cross sectional view of the PMOS and NMOS transistors that are used in an inverter, which is a common, frequently used circuit in CMOS ICs. FIG. 2 shows how these structures are biased to obtain electrical isolation between NMOS devices built in the P-type substrate (starting material), and the PMOS devices built in an N-well. (This implementation of CMOS is called N-well CMOS. Other implementations of CMOS are possible, viz. P-well CMOS, in which the starting material is N-type, and a P-type well is formed in the starting material, and twin well CMOS, in which both an N-type well and a P-type well is formed in the starting material, and PMOS devices are formed in the former, while NMOS devices are formed in the latter.)

In the N-well configuration shown in FIG. 2, the reverse biased P-N junction existing between the N-well and the P-type substrate presents a high impedance between these regions, permitting the PMOS device to be biased independently of the NMOS device. Junction isolation technology works very well, and has been used in the vast majority of all integrated circuits ever built. Unfortunately, however, the additional junction, whose only function is to isolate different devices within the IC, introduces, unintentionally, a number of parasitic devices. FIG. 3 shows that the simple CMOS circuit shown in FIG. 2, as implemented in N-well CMOS, has two lateral bipolar NPN transistors LT1, LT2 (denoted as LNPN in FIG. 4) and two vertical bipolar PNPs VT1, VT2 (denoted as VPNP in FIG. 4) associated with it, as well as eight distributed resistors. Similar parasitic transistors exist in P-well and twin well CMOS ICs. These parasitic transistors are normally in an inoperative state, and play no role in the operation of the IC other than isolating different devices. However, they are connected in a configuration similar to that of a four layer diode, i.e. a PNPN configuration. As such, they are capable of being triggered into a state that interferes with the correct operation of the IC. This triggering can occur either by applying the chip bias in an incorrect sequence, by a voltage on an output terminal suffering from an overshoot or undershoot, or by transient currents generated by ionizing radiation. This state, which can be self-sustaining until the power supply is cycled OFF and ON again, is called latchup.

Latchup triggering is the process by which the parasitic devices are switched from the blocking state to "ON" state. Several conditions have been stated as necessary before switching can occur.

1. The loop gain of the PNPN configuration must exceed unity. (Recent research has indicated that this may not be required.)
2. Current through the blocking junction must reach the level defined as the switching current. Turn-on is usually caused by externally excited current flow through one or both emitter/base bypass resistors.
3. The bias supply must be capable of supplying the necessary current.

The first condition for latchup cited above relates to the properties of the two parasitic bipolar transistors. In the static case, this condition is equivalent to the requirement that the sum of the forward common base current gains of the two transistors must exceed unity, i.e.

$$\alpha_{NPN} + \alpha_{PNP} \geq 1 \qquad \text{Eqn. 1}$$

This condition is overly restrictive when applied to the triode or tetrode configurations, and overly generous for the dynamic situation. Recent studies have refined the requirements on loop gain to include the triode and tetrode cases, and both the static and dynamic latchup cases, but Eqn. 1 has the benefit of simplicity, and shall be used in this document to describe semi-quantitatively the method of latchup suppression of the present invention.

The common base current gain (alpha) of the parasitic bipolar transistors found in CMOS integrated circuits is a complex function of the topology of the structures and the fabrication process(es) used to build them. Factors controlling the values of alpha encountered in practical ICs are discussed below.

In the N-well CMOS configuration being discussed herein, the NPN parasitic bipolar device is a lateral transistor, i.e., minority carriers (electrons in this example) injected into the P-type substrate from an N-type contact diffuse laterally (parallel to the silicon surface) through the P-type substrate, serving as the base of the bipolar device, and are collected by the N-well. One of the N-type diffusions used as a source or drain of an NMOS device serves as the emitter of this parasitic transistor and the N-well serves as the collector. The current gain of this device is given by:

$$\alpha_{NPN} = \gamma_{1,NPN} \gamma_{2,NPN} \qquad \text{Eqn. 2}$$

Where:

$\gamma_{1,NPN}$ is the emitter injection efficiency, i.e. the efficiency with which the emitter injects minority carriers into the base region. It is a function of the ratio of the majority carrier density in the emitter to that in the substrate, approaching one as this ratio gets large and $\gamma_{2,NPN}$ is the base transport probability, i.e. the probability that a minority carrier injected into the P-type substrate by the emitter can travel to the N-well before recombining with a majority carrier, thereby being annihilated. It is a function of the ratio between the distance from the emitter to the N-well and the average distance, $L_n$, which a minority carrier can diffuse before recombining.

The spacing between diffused regions and the isolation well in CMOS ICs is being made smaller and smaller as technology advances, with the result that the gain of lateral devices is becoming more of a problem. The minority carrier diffusion length, L, is a function of the density of recombination centers such as crystal defects. (The method for suppressing latchup according to the present invention involves a procedure which increases the density of such defects locally to degrade L, and hence degrade the current gain of the parasitic lateral bipolar transistor.)

In the N-well CMOS configuration being discussed herein, the PNP parasitic bipolar device is a vertical transistor, i.e. minority carriers injected into the N-well by one of the P-type diffusions flow vertically (normal to the silicon surface) through the N-well serving as the base of this device, and are collected by the substrate. A P-type diffusion used as a source or drain of a PMOS device serves as the emitter of this parasitic transistor, the N-well serves as the base region, and the substrate serves as the collector. The current gain of this device is given by:

$$\alpha_{PNP} = \gamma_{1,PNP} \gamma_{2,PNP} \qquad \text{Eqn. 3}$$

Where:

$\gamma_{1,PNP}$ is the emitter injection efficiency, i.e. the efficiency with which the emitter injects minority carriers into the base region. It is a function of the ratio of the majority carrier density in the emitter to that in the substrate, approaching one as this ratio gets large and $\gamma_{2,PNP}$ is the base transport probability, i.e. the probability that a minority carrier injected into the N-well can travel to the substrate before recombining with a majority carrier, thereby being annihilated. It is a function of the ratio between the distance from the emitter to the substrate, and the average distance, $L_p$, which a minority carrier can diffuse before recombining. The isolation well depth in CMOS ICs is being made smaller and smaller as technology advances, with the result that the gain of vertical devices is becoming more of a problem. The minority carrier diffusion length, $L_p$, is a function of the density of recombination centers such as crystal defects.

To initiate latchup in CMOS ICs, lateral current flow is required to turn on the parasitic devices. Various excitations can produce lateral current flow and trigger latchup if sufficiently large. These modes can be divided into three types, viz.

Type 1: External Initiation of First Bipolar

In Type 1 triggering, some excitation has turned on the first bipolar transistor, usually an overshoot or undershoot at an input and/or an output node of the IC. Latchup follows if the second transistor is turned on by the first, and if the total current into the parasitic PNPN reaches the switching current for the particular PNPN triode structure that results when the bypass resistor on the first transistor is removed. Latchup is sustained if the total current has also reached the switching current for the full tetrode structure. If the total current lies between the switching currents for the two configurations, latchup is temporary, and the PNPN device returns to the blocking state once the external source is removed.

Type 2: Normal Bypass Current Initiation of Both Bipolars

In Type 2 triggering, the excitation causes current to flow through both bypass resistors. The excitation in this case is usually avalanche current, photocurrent, or displacement current through the well/substrate junction. Usually the transistor with the larger bypass resistor turns on first. For latchup to occur, the second transistor must also turn on, and PNPN current must reach the switching current as calculated for the full tetrode configuration. Latchup is then always sustained.

Type 3: Degraded Bypass Current Initiation of Both Bipolars

In Type 3 triggering, the excitation has already degraded the blocking state by creating a lower impedance path. This path is between the power supply and ground or between power supply and substrate supply, in the case of punch-through or a field FET device. In the case of source/drain avalanche, it is between the power supply and a signal line or between a signal line and the substrate supply. In this case, the first transistor is not exhibiting bipolar transistor action, but is supplying current that, if large enough, can turn on the second transistor. At least temporary latchup occurs once the PNPN current has reached the switching current calculated for the triode configuration formed by removing the excited transistor's bypass resistor. Whether latchup is sustained depends on the same set of conditions as for Type 1 triggering.

FIG. 5 summarizes turn-on sequences leading to latchup for the various excitations for N-well CMOS.

The static requirements on the current supply which must be met for latchup to occur are obvious. A sufficient switching current must be available for the parasitic circuit to leave the blocking state and the supply must be capable of supplying the holding current, $I_H$, for the parasitic circuit to reach the "ON" state. In addition to these requirements, however, the actual triggering waveform is important for understanding whether latchup occurs. Because of finite base transit times and possible RC time constant limits of applied pulses, any excitation must be applied for a critical length of time, which is the time to bring the PNPN device current up to the switching current. Excitation applied for a shorter time, regardless of its magnitude, does not cause latchup.

In normal operation, the circuit shown in FIG. 2 would exhibit a high impedance current-voltage characteristic between the supply and ground. If it is triggered into the latchup state, and if the latchup persists' after the triggering condition is removed, the latchup is described as self-sustaining. If this occurs, the chip current-voltage characteristic switches to a low impedance region. FIG. 1 shows a representative current-voltage characteristic for a CMOS integrated circuit, showing the high impedance region (Region I, Forward blocking region) and the low impedance region (Region II, ON Region).

If the power supply is stiff, i.e. if it maintains its output voltage despite high load current, the power supply will push high currents through the chip, since the impedance which the chip presents to the power supply in Region II is very low. These high currents can easily exceed the current for which the chip was designed, and the chip metallization may suffer burnout. This would represent permanent failure.

If the power supply is not stiff, and the voltage across the chip drops due to the high current drain, the circuitry on the chip will not be able to operate because of low voltage. This can be corrected by turning off the power to the chip, and then turning the chip ON again. This is called "toggling" the latch. It removes the current from the parasitic bipolar transistors, and when voltage is re-applied, they return to the high impedance state, permitting the chip to resume operation. If the voltage across the chip drops below $V_H$, the circuit will toggle itself, and will return to the high impedance state, permitting renewed operation without external assistance.

In either of the first two cases, a loss of circuit function occurs as a result of the latchup. In the first case, a permanent failure results. In the second case, the loss of functionality is temporary, but requires intervention to overcome the failure. In the third case, the circuit recovers without intervention. However, this case is still problematic, because the CMOS integrated circuit will not function for some period of time during which the minority carrier concentration in the parasitic elements returns to normal. Any of these cases would be very serious in many applications, and users want chips that are incapable of latchup.

The present invention as described herein comprises a post-manufacturing step that can be performed, either at the wafer level or the die level, to reduce or even eliminate latchup sensitivity of ICs. In these regards, the susceptibility of CMOS integrated circuits to certain types of latchup could be significantly reduced if the properties of silicon which control the initiation of photocurrent (a type of normal bypass current discussed under the Type 2 triggering mode) could be degraded, or if the properties of silicon which control the current gain of the parasitic bipolar transistors could be degraded, without degrading the functional properties of the CMOS circuit in either case. The above discussion of latchup shows that the physical processes involved in these types of latchup take place near, but somewhat below, the front surface of the chip. On the other hand, the physical processes involved in MOS transistor operation on which the functional operation of the integrated circuit is based, take place at the front surface of the chip. The difference in the location at which the primary function of the integrated circuit is centered and that at which the parasitic devices operate provides the basis for suppressing latchup without degrading the electrical properties of the integrated circuit.

According to the present invention, ion implantation is a process technique that permits the properties of silicon to be changed in a highly controlled and highly localized manner. Ion implantation is the introduction of ionized atoms into targets with enough energy to penetrate beyond surface regions. The most common application is the doping of silicon during device fabrication. The use of 3- to 500 keV energy for boron, phosphorous, or arsenic dopant atoms is sufficient to implant the ions from about 100 to 10,000 angstroms below the silicon surface. The silicon is annealed after implanting the dopant atoms by heating to elevated temperatures of approximately 600° C. to 1000° C. Annealing decreases the crystalline damage introduced by the implantation process, and causes most of the implanted ions to take substitutional positions in the silicon crystal lattice. This permits the use of ion implantation as a means for introducing dopant atoms into semiconductors.

The present invention deals with a different way to use ion implantation. For purposes of this discussion, it will be assumed that the silicon has already completed the normal production process, and that the finished wafer (or die) can no longer be exposed to temperatures as high as those used in annealing without destroying the device. Furthermore, since the front surface of the chip contains the operational portions of the integrated circuit, ion implantation through this surface would not be desirable. Yet it is desirable to change the properties of the silicon close to the front surface of the chip. Consequently, the present invention deals with the implantation of atoms through the back surface with an energy sufficient to penetrate to a position close to the front surface. There, the atoms can change those properties of the silicon that control the generation and/or collection of photocurrent and the properties of silicon that control the current gain of the parasitic bipolar transistors, yet not cause any significant damage to the front surface of the chip. These changes depend on the chemical and electronic properties of the implanted ions (whether they are inert, such as helium, argon, etc.) or are electronically active (such as metal atoms) or are chemically active (such as oxygen, nitrogen, etc.). They also depend on where the implanted ions come to rest in the target, and the amount of crystalline damage they do in coming to rest.

An individual implanted ion undergoes scattering events with electrons and atoms in the target, reducing the ion's energy until it either leaves the target or comes to rest. The particular loss mechanism is a function of the energy of the ion, E, with electronic interaction prevailing at high energy, and nuclear stopping predominating at low energies. In the present invention we deal with cases where the ion has a high energy when it enters the target material, but loses all of its initial energy and is stopped in the target. In such cases, the primary energy loss mechanism initially is electronic interactions. As the ion slows down, nuclear stopping takes over. The energy loss per unit path length of penetration into the target is called the stopping power. FIG. 6 shows Bragg curves of stopping power for alpha particles and protons in silicon, using as the abscissa the distance remaining to the end of the particle path. Similar curves describe the stopping power of heavier ions, as well.

The total path length of the ion is called the range, R. A typical ion stops at a distance normal to the surface into which the implantation occurs called the projected range, $R_p$. Some ions are statistically lucky, and encounter fewer scattering events in a given distance, and so come to rest beyond the projected range. Other ions are unlucky, and have more than the average number of scattering events. These atoms come to rest between the surface and the projected range. The fluctuation in the projected range is called the straggle, delta $R_p$. There is also a fluctuation in the final ion's position perpendicular to the incident ion's direction, called the lateral straggle, delta $R_{lateral}$.

The range of ions in solids is determined by the LSS theory [J. Lindhard, M. Scharff, and H. Schiott, "Range Concepts and Heavy Ion Ranges", *Mat.-Fys. Med. Dan. Vid. Selsk*, 33, No. 14, 1 (1963)]. Based on this theoretical treatment, the probability of scattering events can be determined and used in Monte Carlo computer codes to determine the profiles of implanted atoms. Alternatively, several analytical expressions have been derived for approximating the depth distribution of implanted ions.

An important feature of ion implantation is the fact that the density of implanted atoms maximizes at $R_p$, with almost all the implanted atoms being found within a distance of three times delta $R_p$ from the range, $R_p$. This means that ion implantation is an ideal method for putting a controlled amount of an ion at a specific location in a semiconductor.

FIG. 7 shows a boron implanted atom profile, with measured data points, four-moment analytical and symmetric Gaussian curves. It can be seen that the forward edge of the implanted profile of boron, (implanted at 800 keV), which is the region of greatest interest this invention, is very well described by both the four-moment and the symmetric Gaussian curves. Profiles for heavier ions (e.g. arsenic) show skewness on the deep side of the implant profile.

As stated above, the ions being implanted lose energy to the target by two types of interactions. First, they have collisions with electrons in target atoms which create electron excitations. The energy lost by the ions in such interactions is subsequently transferred to phonons, which heats the target but produces no permanent damage. The second type of collision displaces target atoms from their original positions. This type of interaction can produce permanent damage to the target, and is one of the types of interaction which this invention exploits.

When a target atom is hit by an ion, a recoil cascade is started. The recoil atom can then collide with other target atoms, generating a number of displacement and replacement collisions, creating vacancies and leaving atoms that participate in the cascade in interstitial positions. (A vacancy is the hole left behind when a recoil atom moves from its original site. An interstitial atom is one that is left in a crystalline position not normally occupied by target atoms.) Vacancies and interstitial atoms of the target material can remain after the ion implantation is completed, and can produce changes in the electronic properties of the target material. In particular, they can serve as trapping and/or recombination centers, degrading both the majority carrier properties and minority carrier properties of semiconductors.

There are three approaches, utilizing ion implantation through the back surface of an integrated circuit, that can be pursued to suppress latchup. The first reduces current flow through one or both emitter/base resistors that arises due to photocurrent across the well junction. Degrading the minority carrier lifetime near the well junction will reduce the photocurrent, and thus reduce the likelihood that latchup will occur. The second approach reduces the voltage drop that a given amount of current across the well junction will produce in the junctions of the parasitic bipolar devices by increasing the conductivity of the silicon. This is accomplished by implanting ions which are electrically conducting near the well junction. The third approach degrades the common base current gain of one or both of the two parasitic bipolar transistors so that the loop gain of the PNPN configuration can not exceed unity. This is done by exploiting the crystalline damage that results from ion implantation. The current gain of the parasitic transistors is degraded by reducing the minority carrier lifetime in the base region of these devices, which occurs as a result of crystalline damage from ion implantation.

Generation of photocurrent in semiconductors such as silicon requires the flow of both minority and majority carriers. The ability to collect minority carriers depends on the distance that a minority carrier can travel before recombining with a majority carrier (the minority carrier diffusion length, L). The minority carrier diffusion length is a function of the density of recombination centers such as crystal defects. The method for suppressing latchup proposed herein involves a procedure which increases the density of such defects locally to degrade L, and hence degrade the photocurrent that will be generated by a given radiation exposure.

FIGS. 3, 4 and 5 show the role played by the resistances in the circuit containing the parasitic bipolar transistors. In every case, the voltage drops across these resistances play a substantial role in causing latchup. If these resistances could be reduced in magnitude, either a larger current would be required to induce latchup, or latchup could be avoided altogether. The implantation of metallic atoms is a method of reducing these resistance which is compatible with the post-production procedure described in this invention. If the implanted ions are metallic, they will supply charge carriers which can reduce the resistance and thereby reduce the voltage drop across the emitter-base junctions of these parasitic transistors.

The current gain of a bipolar transistor depends on the probability that a minority carrier injected into the base of such a device can travel to the collector before recombining with a majority carrier, thereby being annihilated. It is a function of the ratio between the width of the base and the average distance, L, which a minority carrier can diffuse before recombining. The minority carrier diffusion length is a function of the density of recombination centers such as crystal defects. The method for suppressing latchup proposed herein involves a procedure which increases the density of such defects locally to degrade L, and hence degrade the current gain of one or both parasitic bipolar transistors.

3.0 SUMMARY OF INVENTION

The present invention comprises a procedure for treating integrated circuit chips so that the probability that they can be triggered into the latchup state is reduced or eliminated. This procedure is implemented after the integrated circuit has completed its normal production process, and consists of implanting into the back surface of the integrated circuit chip heavy ions which are sufficiently energetic to penetrate the chip to within a short distance of the front surface of the chip, but to come to a stop before reaching the front surface of the chip. (The front surface of an integrated circuit is the surface on which the operational portions of the chip lie. The back surface is the surface opposite to the front surface.) Since the ions do not reach the front surface of the IC, they do not affect the normal function of the chip, but they do affect the parasitic devices that are responsible for causing latchup. As these ions travel through the target, they lose energy by electronic excitations and by atomic collisions. The former result in no permanent damage to the target, while the latter do cause permanent damage to the target. Both contribute to slowing down and eventually stopping the ion beams, provided that the thickness of the target is sufficiently large. Ion implantation in this fashion accomplishes two things. First, it introduces the implanted ions, which can affect the electrical properties of the silicon. Second, it causes crystalline damage to the semiconductor, which can also affect the electrical properties of the silicon. Both of these results can be used to suppress latchup according to the present invention.

As stated above, the implanted ions will enter the silicon through the surface of the silicon opposite to the surface onto which the integrated circuit has been formed (the back surface), will travel through the silicon, and will be completely stopped within a narrow, controlled distance from the front surface. This ion implantation will change the properties of silicon in such a way that the process or processes responsible for latchup are inhibited, either from changes in the electrical properties of the silicon due to the electrical properties of the implanted ions, or from the structural damage done to the single crystal, or from both. Since the implanted ions all stop within a narrow region, spaced away from the region in which the components of the integrated circuit are located, the functionality and parameters of the IC are not degraded. Consequently, the procedure of the present invention is a method of processing silicon wafers or die so that the sensitivity to latchup of the ICs on this wafer or die is reduced or eliminated. Since the implantation can be done after the chip is manufactured, it need only be performed on those ICs intended for use under conditions where latchup sensitivity is important (such as military or space systems, or high reliability commercial applications). In this way, the cost impact of the procedure on commercial production is avoided, while the additional step greatly enhances the ability to upgrade commercial ICs to radiation tolerant chips through non-intrusive modifications to the commercial fabrication processes.

4.0 BRIEF DESCRIPTION OF DRAWINGS

FIG. 1 shows the current-voltage characteristic of a CMOS chip in the latchup state.

FIG. 1(a) is a circuit diagram of the two parasitic bipolar transistors often found integrated circuits, shown in the positive feedback configuration in which they are usually seen.

Figure 6:
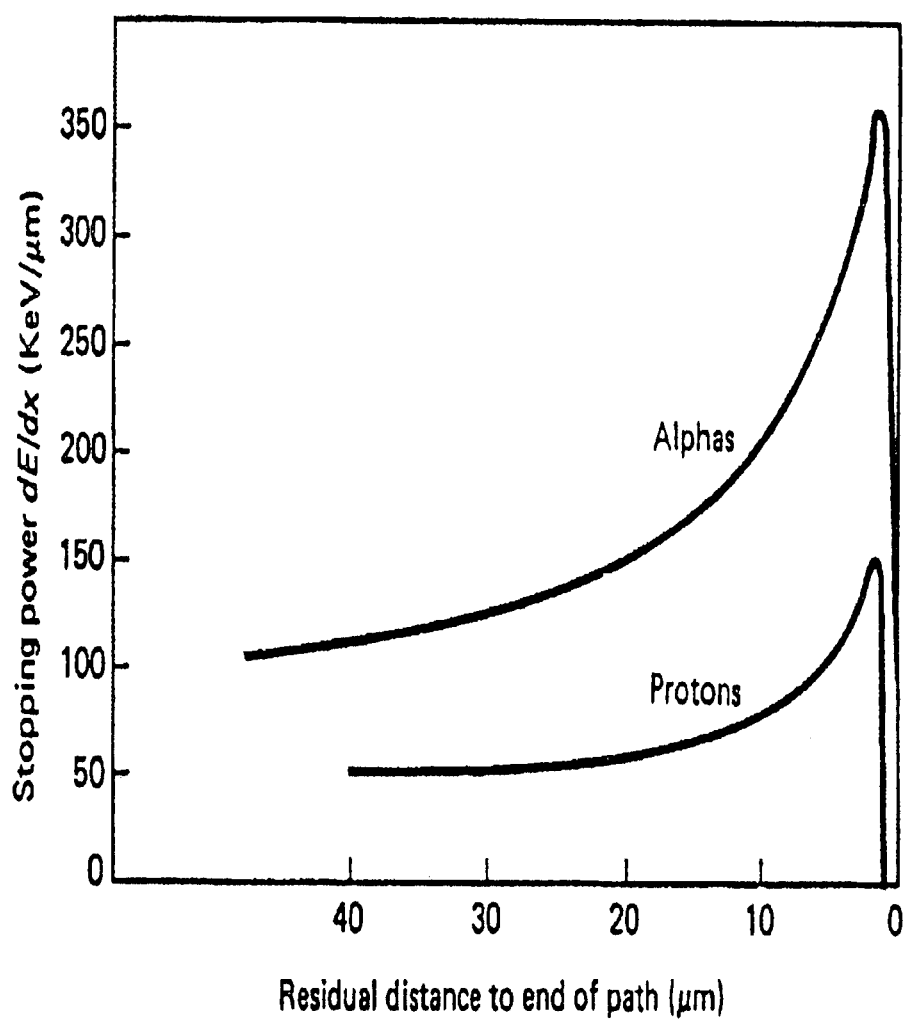

FIG. 2 shows a cross sectional view of the PMOS and NMOS transistors that are used in CMOS ICs, and shows how they are biased to use a junction fabricated in the substrate material to obtain electrical isolation between NMOS devices built in the P-type substrate (starting material in one implementation of CMOS), and the PMOS devices built in an N-well. (Other implementations of CMOS are possible, viz. P-well CMOS, in which the starting material is N-type, and a P-type well is formed in the starting material, and another, called twin well CMOS, in which both an N-type well and a P-type well is formed in the starting material.)

FIG. 3 shows the parasitic bipolar transistors found in N-well CMOS.

FIG. 4 shows the lumped element model of parasitic devices in CMOS.

FIG. 5 shows a useful Latchup Triggering Taxonomy.

FIG. 6 shows Bragg curves of stopping power vs. residual distance to end of track for alpha particles and protons in silicon.

FIG. 7 shows a boron implanted atom profile, with measured data points, four-moment analytical and symmetric Gaussian curves.

FIG. 8 shows the integrated charge collection in epi and bulk structures following a 100 MeV Fe strike. An "epi structure" is one in which the starting silicon wafer (heavily doped P-type silicon for N-well CMOS) has an epitaxial layer of more lightly doped P-type silicon grown on it, and the remaining process steps performed on this epitaxial layer. A "bulk structure" is one in which the starting silicon wafer (less heavily doped P-type for N-well CMOS) has the remaining process steps performed directly on the starting material.

FIG. 9 shows the normalized value of implanted ion concentration as obtained from Eqn. 9 herein for nitrogen ions with an energy of 45 MeV implanted into silicon.

5.0 DETAILED DESCRIPTION OF INVENTION

According to the present invention, there are three approaches, utilizing ion implantation through the back surface of an integrated circuit, that can be pursued to suppress latchup. The first reduces current flow due to photocurrent across the well junction. Degrading the minority carrier lifetime near the well junction will reduce the photo-current, and thus reduce the likelihood that latchup will occur. The second approach reduces the voltage drop that a given amount of current across the well junction will produce in the junctions of the parasitic bipolar devices by increasing the conductivity of the silicon. This is done by implanting ions which are electrically conducting near the well junction. The third approach degrades the common base current gain of one or more of the parasitic bipolar transistors so that the loop gain of the PNPN configuration can not exceed unity. This is done by exploiting the crystalline damage that results from ion implantation. The current gain of the parasitic transistors is degraded by reducing the minority carrier lifetime in the base region of these devices, which occurs as a result of crystalline damage from ion implantation.

The first approach to latchup suppression according to the present invention calls for the suppression of photocurrent across the well junction. Exposure of semiconductors such as silicon to ionizing radiation results in the creation of both majority charge carriers and minority charge carriers, in equal numbers. The details of how these charge carriers produce photocurrents vary widely depending on the nature of the ionizing radiation, the mode of operation of the integrated circuit, and other factors. Since latchup in space applications due to space radiation (called Single Event Latchup, or SEL) is of significant concern, this shall be the type of radiation used to serve as an example of how the concept taught herein suppresses latchup triggered by ionizing radiation, but the concept applies to latchup triggered by other types of ionizing radiation, as well.

When a heavy, high energy ion, such as a cosmic ray, penetrates a semiconductor device, it produces a track of ionization of such intensity that it swamps the equilibrium carrier density along its path. This plasma track loses energy to the surrounding material, coming into thermal equilibrium within picoseconds. The track radius is initially less than 0.1 microns in diameter, with an initial charge density of about 1E18 to 1E21 charges/cm$^3$. Following thermalization of the track, its cylindrical track begins to expand radially by ambipolar diffusion. Strong electrostatic restoring fields in the track maintain this charge state. During this stage, holes and electrons begin to separate on the track periphery where the track carrier densities approach that of the semiconductor. The majority carriers are drawn away from the track by vertical components of the electric field, and are driven down into the substrate. The minority carriers are driven up the track and most are collected at sensitive nodes. As the charge density in the track is reduced, the depletion layers begin to revert to their original configuration, first at the track periphery and then inward toward the track center. The charge collected during the early stages of the track decay arise from drift, while those collected during the later stages flow mainly from diffusion.

FIG. 8 compares the integrated charge collection in a silicon diode fabricated on bulk silicon to that from a diode fabricated on a layer of epitaxial silicon fabricated on heavily doped silicon, following a strike from a 100 MeV iron ion. The former diode is seen to produce more charge, most of which is produced between 1E-10 and 1E-8 seconds. The latter diode produces somewhat less charge, but does it over a period from 1E-11 to 1E-6 seconds. The time history of track generation and decay play an important role in the triggering of latchup by space radiation. Because of the importance of parasitic bipolar transistors in latchup, photocurrent flow that is completed before the bipolar transistors can respond play no role in SEL. The speed of photocurrent response is influenced by the linear energy transfer (LET) of the ion, resistivity of the integrated circuit at the point of the ion strike, the applied voltage, etc.

The present invention deals with a technique for reducing the photocurrent across the well junction by degrading the minority carrier lifetime near the junction, thus reducing the likelihood that latchup will occur. The technique involves a procedure which increases the density of crystalline defects locally, and hence degrade the photocurrent that will be generated by a given radiation exposure.

Typical silicon crystals have imperfections which introduce energy states in the range of energies which would be unallowable (the so-called "forbidden band") in perfect crystals. These imperfections can be crystal dislocations, impurity atoms, combinations of vacancies and impurities, and displacement damage due to radiation. Such defects increase both the rate of generation of hole-electron pairs and the rate of recombination of these pairs. The recombination rate for hole-electron pairs as the result of displacement damage, R, is given by the pre-irradiation value, $R_0$, and the increase in recombination rate, delta R, due to radiation delta R has been shown to be proportional to the fluence of the particles causing the displacement damage. The resultant recombination rate is given by $$R = R_0 + \Delta R = R_0 + K\phi \qquad \text{Eqn. 4}$$

where phi is the fluence of radiation producing the displacement damage, and K is the radiation damage constant. The excess minority carrier density divided by the recombination rate is called the minority carrier lifetime, tau, which is the mean time that a minority carrier survives before recombining.

Semiconductor material of the type used in integrated circuits typically have high levels of crystalline perfection. When the material is subjected to heavy ion bombardment, disorder in produced in the single crystal lattice. The energy lost by the heavy ion in producing displacement damage is called the non-ionizing energy loss (NIEL), and the vacancy density produced by the ions is directly proportional to the NIEL. If we designate the vacancy density per micron per ion at a depth x as V(x), the NIEL in units of MeV-cm$^2$/gm is given by Eqn. 5.

$$NIEL = \frac{KV(x)}{\rho} \qquad \text{Eqn. 5}$$

where $$K = 0.01\left(2 + \frac{T_d}{0.4}\right) \qquad \text{Eqn. 6}$$

For silicon, the density is taken as rho=2.321 gm/cm$^2$, and $T_d$ as 21 eV. Then K=0.545. NIEL can be calculated from computer codes such as TRIM (J. F. Ziegler "The Stopping and Range of Ions in Matter", Pergamon Press, 1977–1985) for a wide range of ions and energies, and the NIEL calculated from these equations. For example, if boron is implanted at 125 MeV, the range of the implant is 400 microns, and the peak vacancy density is found to be 728 vacancies/micron/ion. This yields a NIEL value of 170.94 MeV-cm$^2$/g. For a 28.5 MeV helium ion implant, the peak vacancy density is found to be 5.534 vacancies/micron/ion. This gives a NIEL of 1.2994 MeV-cm$^2$/g. Thus, the boron ion implantation is 131.6 times more damaging that the helium implantation at the peak density point.

Some of the vacancies produced by displacement damage are annihilated by combining with displaced silicon atoms, while some form stable defects. Various researchers have shown that the permanent damage resulting from displacement damage in semiconductors is strongly correlated with NIEL. In particular, minority carrier lifetime damage is directly proportional to the NIEL. Consequently, damaging semiconductors by ion implanting heavy ions into the back surface of an integrated circuit to within a small distance of the front surface of an integrated circuit will reduce the photocurrent generated across the well junction of CMOS, and reduce the sensitivity of the device to single event latchup.

The second approach to suppressing latchup according to the present invention involves reducing the voltage drop that a given amount of current across the well junction will produce in the emitter-base junctions of the parasitic bipolar devices. This is done by increasing the conductivity of the silicon through which this current flows from the well junction to an outside contact by implanting ions which are electrically conducting in the region of the substrate and/or well (Cf. FIG. 3).

If the implanted ions are inert atoms, such as helium, argon, etc., then the dominant effect of the implantation will be the damage that the implanted ions produce. If, however, the implanted ions are atoms which can contribute charge carriers to the silicon (e.g. boron, nitrogen, etc.), the implant can increase the lateral conductivity, and thereby reduce the voltage drop across the junctions of parasitic transistors. FIG. 5 shows that the voltage drop produced by the photocurrent across the larger of the two resistors $R_w$ or $R_s$ will trigger latchup. It has been shown that reducing the resistance of the well resistor ($R_w$) or the substrate resistor ($R_s$) will reduce the sensitivity of the integrated circuit to single event latchup.

The third approach to single event latchup suppression according to the present invention degrades the current gain of one or more of the parasitic bipolar transistors so that the loop gain of the PNPN configuration can not exceed unity. Eqn. 1 states this requirement in terms of the common base current gain. This can also be stated in terms of the common emitter current gain, beta. In this case, Eqn. 1 can be restated as Eqn. 7.

$$\beta_V \beta_L > \qquad \text{Eqn. 7}$$

The effects of displacement damage on the beta of the parasitic transistors is given by Eqn. 8.

$$\Delta \frac{1}{\beta} = t_b K \phi \qquad \text{Eqn. 8}$$

where $$\Delta \frac{1}{\beta}$$

is the change the reciprocal of beta due to radiation $t_b$ is the base transit time (the time it takes minority carriers to travel across the base from the emitter to the collector) phi is the fluence of the particle producing the radiation damage K is the damage constant for the particle in question Consequently, exposing the integrated circuit to ion implantation from the back surface will, if the energy of the implanted ions is selected to cause the implanted ions to stop a short distance from the front surface of the chip, degrade the current gain of the parasitic bipolar transistor(s) to the point that single event latchup will be suppressed or eliminated.

6.0 Experimental Data on High Energy Ion Implantation

In support of the foregoing and to provide information as to how one of ordinary skill in the art may select implant ions of proper initial energies for implantation to a narrow region spaced from a front surface on a silicon substrate, the following discussion and experimental data are offered.

When heavy ions are implanted into silicon (or other solids), it is found that the average implanted ion travels a distance $R_p$ (called the range), with $R_p$ increasing with the initial energy of the ion. These ions slow down and eventually stop as a result of energy loss mechanisms which include electronic stopping and nuclear collisions, with each interaction removing a small fraction of the ions energy. Since the energy loss interactions between the ion and the solid are selected probabilistically, the distance which the ions travel before stopping varies somewhat from ion to ion about the value $R_p$, the average for the ensemble. This variation about the average range is described by a parameter called "straggle", and is represented by the symbol $\Delta R_p$.

The theory of ion implantation is based on the work of Lindhard, Scharff, and Schiott, and is called the LSS theory (J. Linhard, M. Scharff and H. Sciott, "Range concepts and heavy ion ranges", Mat-Fys. Med. Dan. Vid. Selsk, Vol. 33, No. 14, 1, 1963). The LSS theory predicts that the concentration of implanted atoms will vary with distance into the target as shown in Eqn. 9.

$$N(x, E) = N_{MAX} \exp\left[\frac{-(x - R_P(E))^2}{2(\Delta R_P(E))^2}\right] \qquad \text{Eqn. 9}$$

where $R_p(E)$ is the range of the ion, and depends on its initial energy $\Delta R_p(E)$ is the straggle of the implanted ion beam, and is also a function of the initial energy of the ions Thus, if the range and straggle are known for the ion of interest, the damage profile produced by the ion implantation can be calculated. Ion Range Tables, providing estimates of the ion range and its longitudinal and lateral straggle, can be obtained from a computer program called TRIM, which is available as freeware at the IBM Research web site (www.research.ibm.com/ionbeams). TRIM can be used to calculate, using Monte Carlo techniques, the density of ions implanted in an arbitrary target vs. distance into the target for any selected beam energy (within a wide range of possible energies). From the resultant plot of density vs. distance, one can determine the range and straggle of the ions for that energy. Alternatively, one can calculate range and straggle using the program PRAL (Projected Range Algorithm, an analytical program included in the TRIM suite).

FIG. 9 shows the normalized value of the implanted ion concentration near the end of range, as obtained from Eqn. 9 for nitrogen ions with an energy of 45 MeV implanted into silicon. Such an ion has a range of 41.5 microns and a straggle of 1.5 microns. This figure shows that if a sample that is 55 microns thick is implanted with 1E9 atoms/cm$^2$ of 45 MeV nitrogen, with the implanted ions entering the solid from the left, the surface of the sample on the right would not be affected by the ions, since no atoms would penetrate that far.

The following Tables compare calculations of heavy ion implantation into silicon made by the PRAL computer code with experimental results for silicon irradiated with high energy ions (E>1 MeV), and shows that the PRAL predictions are confirmed by experimental data. In a literature search, experimental profile data was found for six different types of ions with energies ranging from 4.0 MeV for H to 5.68 GeV for Xe. The ranges derived from the PRAL code were found to be in good agreement with experimental data for all cases studied. That is, the analytical predictions of the distance which an energetic heavy ion will penetrate into silicon were found to agree very well with experimental data. Moreover, values of the straggle, $\Delta R_p$, calculated by PRAL were also found to agree with experimental data.

Experimental data for six different ions at MeV energies are presented in the following tables. The experimental results for the range and longitudinal straggle are compared with values from PRAL and summarized in Tables I and II. The data was obtained for the following elements from the following references for H (N. Q. Khanh, Cs. Kovacics, T. Mohacsy, M. Adam, J. Gyhulai, "Measuring the Generation Lifetime Profile Modified by MeV H+ Ion Implantation in Silicon", Nucl. Instr. Meth. B 147, 111–115 (1999)), He (P. Hazdra, J. Rubes, J. Vobecky, "Divacancy Profiles in MeV Helium Irradiated silicon from Reverse I-V Measurement", Nucl. Instr. Meth. B 159, 207–217 (1999).), B and P (W. R. Fahrner, K. G. Oppermann, and T. Harms, "5 to 100 MeV Ion Implantation and Its Simulation by the MARLOWE Program", phys. stat. sol. (a) 123, 109–118 (1991)), Al (A. La Ferla, L. Torrisi, G. Galvagno, E. Rimini, G. Ciavola, A. Camera and A. Gasparotto, "Implants of Aluminum in the 50–120 MeV Energy Range into silicon", Nucl. Instr. Meth. B 73, 9–13 (1993)) and Xe (V. S. Varichenko, A. M. Zaitsev, N. M. Kazutchits, A. R. Cheliyadinskii, N. M. Penina, V. A. Martinovich, Ya. I. Latushko, W. R. Farner, "Defect Production in Silicon Irradiated with 5.68 GeV Xe Ions", Nucl. Instr. Meth. B 107, 268–272 (1996)).

As can be seen from Table I, all of the above ranges are in excellent agreement. This is remarkable given the wide range of ion types, energies and different experimental methods. Furthermore, five of the six results are from different research groups.

TABLE I

| Ion | Energy (MeV) | Range ($\mu$m) | |
|---|---|---|---|
| | | Experiment | PRAL |
| H | 4.01 | 144.25 | 146.8 |
| He | 21.9 | 247.1 | 248.6 |
| B | 112.0 | 334.4 | 333.9 |
| Al | 100.0 | 38.7 | 39.3 |
| P | 65.0 | 21.6 | 20.1 |
| Xe | 5680.0 | 620.5 | 614.0 |

The straggle is obtained from the experimental data by measuring the full width at half maximum (FWHM) of the profile graphs presented in the respective papers. This is a common procedure and assumes the profile is approximated by a normal distribution. The standard deviation is given by dividing FWHM by a factor of 2.355. In most cases the PRAL straggle is close to that observed, as is seen in Table II. Exceptions are He and B where the experimental values are significantly higher and lower respectively than the PRAL value. The PRAL model would therefore underestimate and overestimate the width of the implant or damage zone for those atoms at the specified energies.

TABLE II

| Ion | Energy (MeV) | Straggle ($\mu$m) | |
|---|---|---|---|
| | | Experiment | PRAL |
| H | 4.0 | 8.27 | 6.36 |
| He | 21.9 | 15.16 | 9.77 |
| B | 112.0 | 4.90 | 13.82 |
| Al | 100.0 | 1.38 | 1.38 |
| P | 65.0 | 0.57 | 0.65 |
| Xe | 5680.0 | 17.40 | 22.08 |

Calculation of implant profiles is straightforward. The two parameters of the normal distribution are obtained from PRAL for the ion and energy of interest. The area under the distribution is then adjusted to match the total number of ions injected into the silicon. We should caution that this applies to high energies where the peak implant density is well removed from the surface at which the beam enters. The exact limits will vary depending upon the ion and target. At low energies (E<1 MeV) the distribution is more complex and generally requires up to four parameters.

We also found that the implant damage distribution in the peak damage zone could be well represented by a normal distribution, using the projected range and straggle parameters from PRAL. Calculation of the complete damage profile is more complicated since there is a damage tail leading up to the peak damage zone. Damage in this tail region can be determined by a calculation of the non-ionizing energy loss (NIEL), and a combination with the damage calculated in the peak damage zone calculated by using a normal distribution.

From the foregoing experimental information, it should be apparent that in the method of the present invention it is important to determine the thickness of the silicon substrate housing the IC and to carefully select and/or control the initial energy of the implant ion as it enters the back surface of the substrate. In selecting and controlling the initial energy of the implant ion, the anticipated range and straggle of the implant ion need to be determined. Accordingly, in a more detailed method according to the present invention the steps of (1) determining the thickness of the silicon substrate, selecting the implant ion and initial implant energy therefore, (2) determining the range and straggle for the selected implant ion at different initial energies, and (3) controlling the initial energy of the implant ion to an implant ion profile within the silicon substrate less than the thickness of the silicon substrate, are important.

While the foregoing generally and specifically describe the techniques for suppressing latchup by means of back-surface ion implantation to within a small distance from the front surface of an integrated circuit, the following claims are intended to define the scope of that invention.

What is claimed is:

1. A method of suppressing latchup in an integrated circuit (IC) previously formed on a front surface of a silicon substrate comprising implanting energetic ions through a back surface of the substrate to a region spaced from the front surface of the substrate, the energetic implant ion having a doping profile less that the depth of the silicon substrate.

2. The method of claim 1 wherein latchup is suppressed by implanting the ions so that they completely stop within a small distance from the front surface and in stopping damage the silicon so that photocurrent generated in the IC upon exposure to ionizing radiation is reduced.

3. The method of claim 1 wherein latchup is suppressed by implanting metal ions so that the region comprises a conducting region in the substrate which reduces photocurrent induced voltage drops in the IC.

4. The method of claim 1 wherein the IC includes parasitic bipolar transistors and latchup is suppressed by implanting the ions so that they damage the silicon substrate and the parasitic bipolar transistors giving rise to latchup.

5. The method of claim 1 further comprising:

determining the thickness of the silicon substrate, selecting the implant ion and initial implant energy therefore, determining the range and straggle for the selected implant ion at different initial energies, and controlling the initial energy of the implant ion to produce an implant ion profile within the silicon substrate less that the thickness of the silicon substrate.

\* \* \* \* \*